United States Patent [19]

Mandai et al.

[11] Patent Number: 5,166,108

[45] Date of Patent: Nov. 24, 1992

[54] LOW TEMPERATURE-SINTERING PORCELAIN COMPONENTS

[75] Inventors: Harufumi Mandai; Kimihide Sugo, both of Nagaokakyo, Japan

[73] Assignee: Murata Manufacturing Co., Ltd., Japan

[21] Appl. No.: 675,078

[22] Filed: Mar. 25, 1991

[30] Foreign Application Priority Data

Mar. 26, 1990 [JP] Japan ................................. 2-77195

[51] Int. Cl.$^5$ ..................... C03C 8/02; C04B 35/10; C04B 35/14
[52] U.S. Cl. ................................. 501/153; 501/15; 501/17; 501/22; 501/154
[58] Field of Search ................. 501/15, 17, 141, 154, 501/153, 22

[56] References Cited

U.S. PATENT DOCUMENTS 3,907,585  9/1975  Francel et al. ..................... 501/15
3,973,975  8/1976  Francel et al. ..................... 501/15

Primary Examiner—Mark L. Bell
Attorney, Agent, or Firm—Ostrolenk, Faber, Gerb & Soffen

[57] ABSTRACT

In the low temperature-sintering porcelain components of the present invention, designating as A a group of main components containing 40.0–70.0% by weight of a Si component equivalent to $SiO_2$, 25.0–55.0% by weight of a Ba component equivalent to $BaCO_3$, 2.0–10.0% by weight of an Al component equivalent to $Al_2O_3$, 1.0–3.0% by weight of a B component equivalent to $B_2O_3$, 0.3–3.0% by weight of a Cr component equivalent to $Cr_2O_3$, and 0.3–3.0% by weight of a Ca component equivalent to $CaCO_3$, and designating $Pb_3O_4$ as B, the low temperature-sintering porcelain components of the invention are ones which satisfy the following relations:

80% by weight $\leq A < 100$% by weigth and

0% by weight $< B \leq 20$% by weight.

3 Claims, No Drawings

LOW TEMPERATURE-SINTERING PORCELAIN COMPONENTS

BACKGROUND OF THE INVENTION

1. Field of the Invention

This invention relates to low temperature-sintering porcelain components and, more particularly, to low temperature-sintering porcelain components suitable for an electric circuit substrate, for example, a multi-layer electric circuit substrate in which a plurality of sheet-form porcelains are laminated and electric circuits are formed on the porcelains.

2. Description of the Prior Art

Heretofore, a multi-layer electric circuit substrate which comprises electric circuit elements such as inductors, capacitors, and resistors in a unified substrate has been developed.

Recently, the multi-layer electric circuit substrate of this type has been increasingly used for applications in a high frequency range, and copper or the like having low resistivity in the high frequency range has attracted attention as a conductor material.

The inventors of this invention have proposed several kinds of porcelain components which can be baked at a low temperature and can produce porcelain having a high insulation resistance and a low dielectric constant. These porcelain components have been disclosed in, for example, Japanese Patent Provisional Publication No. 128964/1987 and Japanese Patent Provisional Publication No. 226855/1987. The former Provisional Publication has disclosed a porcelain component containing, as the main component 25-80% by weight of $SiO_2$, 15-70% by weight of either BaO or SrO, or both of them, and 1.5-5.0% by weight of $B_2O_3$, and further 30% or less by weight of $Al_2O_3$ if necessary, and adding any one of $Cr_2O_3$, CuO, NiO, $Co_2O_3$, and $Fe_2O_3$, wherein when the additive is $Cr_2O_3$ or CuO, it is added within the range of 0.2-10% by weight and when the additive is NiO, $Co_2O_3$ or $Fe_2O_3$, it is added within the range of 1-10% by weight.

These conventional porcelain components can be sintered in a non-oxidation environment at 1000° C. and copper can be used as a conductor material.

However, the porcelain made of these conventional porcelain components has a dielectric constant $\epsilon$ of 6.1, Q-value of 1,400 (at 1 MHz) and a break-resistance force of about 1,600 Kg/cm². Thus the Q-value is small and the break-resistance strength is weak.

Also, in order to increase the packaging density of an electric circuit substrate, it is necessary to internally contain cermet resistances. However, these conventional porcelain components have optimum baking temperatures ranging from 970°-1000° C., and resistance material such as cermet resistance can not be used at the baking temperature because of the high temperature. Further, an Inconel muffle is generally used as a material of a kiln, but its highest working temperature is said to be 1000° C. and when it is always used at this temperature, deterioration of the kiln becomes severe.

Conventionally, it is known that the baking temperature can be decreased by adding alkali metal oxide such as $Li_2O$ or $Na_2O$, or PbO for low temperature baking of the porcelain components, and generally technology has been proposed for decreasing the baking temperature by adding PbO as a glass component such as borosilicate lead.

However, in the above technology a large amount of the glass component such as borosilicate lead is added for decreasing the baking temperature and the break resistance force is improved, but the insulation resistance is impaired due to metallized deposition of PbO when a conductor material of the internal electrode such as copper is simultaneously baked in a non-oxidation environment.

SUMMARY OF THE INVENTION

Therefore, it is a principal object of the present invention to provide low temperature-sintering porcelain components which can be baked together with the copper of the conductor material regardless of using PbO and can be baked at a low temperature and can produce porcelain having an improved break-resistance strength and Q-value and further a high insulation resistance and a low dielectric constant.

Further, it is another object of the present invention to provide low temperature-sintering porcelain component which can retard kiln deterioration.

In the low temperature-sintering porcelain components of the present invention, designated as A is a group of main components containing 40.0-70.0% by weight of a Si component equivalent to $SiO_2$, 25.0-55.0% by weight of a Ba component equivalent to $BaCO_3$, 2.0-10.0% by weight of an Al component equivalent to $Al_2O_3$, 1.0-3.0% by weight of a B component equivalent to $B_2O_3$, 0.3-3.0% by weight of a Cr component equivalent to $Cr_2O_3$, and 0.3-3.0% by weight of a Ca component equivalent to $CaCO_3$, and designating $Pb_3O_4$ as B, the low temperature-sintering porcelain components of the invention are ones which satisfy the following relations:

80% by weight $\leq$ A < 100% by weight and

0% by weight < B $\leq$ 20% by weight.

Accordingly to the present invention, the low temperature-sintering porcelain components are obtained which can be baked together with copper of the conductor material and can be baked at a low temperature and can produce porcelain having an improved break-resistance strength and Q-value and further a high insulation resistance and a low dielectric constant.

The low temperature-sintering porcelain components of the invention can be baked together with the copper of the internal electrode conductor material regardless of using PbO, and thus a multi-layer electric circuit substrate internally containing, for example, cermet resistors can be obtained.

Further, the low temperature-sintering porcelain components of the invention can be baked at a temperature around 900° C., for example, at 850° C. Therefore, the low temperature-sintering porcelain components of the invention can retard kiln deterioration.

In addition, the porcelain obtained from the low temperature-sintering porcelain components of the invention has, for example, a dielectric constant $\epsilon$ of 6.1, Q-value of 2500 (at 1 MHz), a break-resistance force of about 2000 Kg/cm², and thus has a better Q characteristic most suitable for a high frequency range and improved break-resistance force as compared with the conventional examples.

The above and other objects, features, aspects and advantages of the invention will become more apparent from the following detailed description of the embodiments.

DESCRIPTION OF THE PREFERRED EMBODIMENTS $SiO_2$, $BaCO_3$, $Al_2O_3$, $B_2O_3$, $Cr_2O_3$ and $CaCO_3$ were weighed and mixed so as to obtain raw materials I, II and III according to the composition ratio of the appended Table 1. These material mixtures were calcined and then ground and designated as raw materials I, II and III.

Further, the raw material I, II or III was mixed with $Pb_3O_4$ and kneaded, mixed with organic binder and then formed into a sheet of 1 mm thick by the doctor blade process and made into a green sheet so as to obtain porcelain with composition ratios of the appended Table 2.

As seen in Table 2, the composition contains:
50-65% by weight of $SiO_2$,
25-30% by weight of $BaCO_3$,
4-10% by weight of $Al_2O_3$,
2-2.5% by weight of $B_2O_3$,
1.5% by weight of $Cr_2O_3$,
1.5-2% by weight of $CaCO_3$, and
5-20% by weight of $Pb_3O_4$.

This green sheet was cut into rectangular plates having a 30 mm length and 10 mm width and on the surfaces of these plates copper paste which was made by mixing copper powder and organic vehicle at a ratio of 80:20 by weight was printed to form copper electrodes. Then these printed plates were inserted into baking boxes made of ceramics and baked at a temperature within the range of 850°-1000° C. for one hour in a reducing environment of nitrogen-hydrogen or a non-oxidation environment to prepare samples.

Reactions of the baking boxes for these samples were visually checked. A box sticking the sample or a box changing partially color of the sample surface was marked with "X" to indicate a severe reaction of the box and the other boxes were marked with "O" to reflect non-severe reactions of the boxes in Table 2.

Further, the solderability of these samples was checked. This solderability was checked by dipping the samples in a solder bath while maintaining the solder temperature at 250° C., and when more than 95% of the copper electrode surface area was covered by the solder, the sample was marked with "O" if it had good solderability, and in the other case the sample was marked with "X" indicated bad solderability in Table 2.

Dielectric constants and insulation resistances of these samples were measured. Each sample has a good dielectric constant of 6.1 and a good insulation resistance, and thus these characteristics are not intentionally shown in Table 2.

The Q-values and break-resistance forces of the samples with numbers 2, 3, 6-9 were measured and each of the samples had the Q-value of 2500 and the break-resistance force of about 2000 Kg/cm$^2$.

The samples marked with * with on the right side of the sample number are outside the scope of this invention and the others are within the scope of this invention.

The reasons why the range of composition of the low temperature-sintering porcelain components of this invention is defined are as follows:

(1) When a $SiO_2$ composition is less than 40% by weight, the dielectric constant increases to more than 9.0 and this impairs electronic circuits characteristics in a high frequency range. When the $SiO_2$ composition is more than 70% by weight, the baking temperature exceeds 1000° C., and thus, for example, copper can not be used for the internal conductor material, and this is not preferable.

(2) When a $BaCO_3$ composition is less than 25% by weight, the break-resistance strength is 1500kg/cm$^2$, that is, somewhat low and the baking temperature tends to rise and this is not desirable. When the $BaCO_3$ composition is more than 55% by weight, the dielectric constant exceeds 9 and this is not favorable.

(3) When an $Al_2O_3$ composition is less than 2% by weight or more than 10% by weight, the baking temperature tends to rise and this is not preferable.

(4) When a $B_2O_3$ composition is less than 1% by weight, the baking temperature exceeds 1000° C., and when the $B_2O_3$ composition is more than 3% by weight, the optimum baking temperature range is narrowed to less than 15° C., both of which are not desirable.

(5) When a $Cr_2O_3$ composition is less than 0.3% by weight, the solderability becomes bad, and when the $Cr_2O_3$ composition is more than 3% by weight, the insulation resistance sometimes decreases, both of which are not preferable.

(6) When a $CaCO_3$ composition is less than 0.3% by weight, the optimum baking temperature range is narrowed to less than 15° C., and when the $CaCO_3$ composition is more than 3% by weight, the baking temperature exceeds 1000° C. and both of these are not desirable.

(7) When a $Pb_3O_4$ addition ratio exceeds 20% by weight, reactions of the boxes become severe and simultaneously the solderability becomes bad and this causes a problem in practical uses. When the addition ratio is 0% by weight, an effect of low temperature baking can not be obtained.

On the contrary, the low temperature-sintering porcelain components within the scope of the invention can be baked together with copper of the internal conductor material and can be baked at a low temperature. Thus porcelain having an improved break-resistance strength and Q-value and further a high insulation resistance and a low dielectric constant can be obtained.

The low temperature-sintering porcelain components of the invention can be baked simultaneously with copper of the internal electrode conductor material regardless of using PbO, and thus a multi-layer electric circuit substrate internally containing, for example, cermet resistors can be produced.

Further, the low temperature-sintering porcelain components of the invention can be baked at a low temperature about 900° C., for example, at 850° C. and porcelain having a high insulation resistance and a low dielectric constant can be produced. Therefore, the low temperature-sintering porcelain components of the invention can eliminate deterioration of a kiln that bakes the components.

Still further, the low temperature-sintering porcelain components of the invention almost does not react with the baking box in which porcelain is made and also provides good solderability to the electrode formed on the porcelain surface.

Further, the porcelain obtained from the low temperature-sintering porcelain components of the invention has, for example, a dielectric constant $\epsilon$ of 6.1, Q-value of 2500 (at 1 MHz), and a break-resistance force of about 2,000 kg/cm$^2$, that is, a good Q-characteristic suitable for a high frequency range and an improved break-resistance strength as compared with the conventional examples.

In addition, porcelain having a small dielectric constant variation with temperature can be obtained from the low temperature-sintering porcelain components of the invention.

It will be apparent from the foregoing, while the present invention has been described in detail, these are only particular examples and the invention is not limited to these. The spirit and scope of the invention is limited only by the appended claims.

TABLE 1

| Raw Material No. | Main Components (wt %) | | | | | |
|---|---|---|---|---|---|---|
| | $SiO_2$ | $BaCO_3$ | $Al_2O_3$ | $B_2O_3$ | $Cr_2O_3$ | $CaCO_3$ |
| I | 70 | 20 | 4 | 2.5 | 1.5 | 2.0 |
| II | 65 | 25 | 4 | 2.5 | 1.5 | 2.0 |
| III | 50 | 30 | 10 | 2.0 | 1.5 | 1.5 |

TABLE 2

| Sample No. | Raw Material No. | $Pb_3O_4$ (wt %) | Sintering Temperature (°C.) | Reaction of Baking Box | Solderbility |
|---|---|---|---|---|---|
| 1* | I | 100 | 0 | 1000 | ◯ | ◯ |
| 2* | I | 90 | 10 | 930 | ◯ | ◯ |
| 3* | I | 80 | 20 | 870 | ◯ | ◯ |
| 4* | I | 70 | 30 | 850 | X | X |
| 5* | II | 100 | 0 | 990 | ◯ | ◯ |
| 6 | II | 95 | 5 | 950 | ◯ | ◯ |
| 7 | II | 80 | 20 | 870 | ◯ | ◯ |
| 8 | III | 90 | 10 | 920 | ◯ | ◯ |
| 9 | III | 80 | 20 | 860 | ◯ | ◯ |
| 10* | III | 70 | 30 | 850 | X | X |

*indicate ranges outside scope of the invention

What is claimed is:

1. A low temperature-sintering porcelain composition comprising at least 80% of an admixture of:
   40.0–70.0% by weight of $SiO_2$,
   25.0–55.0% by weight of $BaCO_3$,
   2.0–10.0% by weight of $Al_2O_3$,
   1.0–3.0% by weight of $B_2O_3$,
   0.3–3.0% by weight of $Cr_2O_3$,
   0.3–3.0% by weight of $CaCo_3$, and
   greater than 0 to 20% by weight of $Pb_3O_4$.

2. A low temperature-sintering porcelain composition according to claim 1 containing:
   50–65% by weight of $SiO_2$,
   25–30% by weight of $BaCO_3$,
   4–10% by weight of $Al_2O_3$,
   2–2.5% by weight of $B_2O_3$,
   0.3–3% by weight of $Cr_2O_3$,
   1.5–2% by weight of $CaCO_3$, and
   5–20% by weight of $Pb_2O_4$.

3. A low temperature-sintering porcelain composition according to claim 2 containing 1.5% by weight of $Cr_2O_3$.

* * * * *